*(12)* United States Patent
Ho et al.

US011538772B2

(10) Patent No.: US 11,538,772 B2
(45) Date of Patent: Dec. 27, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Cheng-Yu Ho, Kaohsiung (TW); Meng-Wei Hsieh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 19 days.

(21) Appl. No.: 16/953,261

(22) Filed: Nov. 19, 2020

(65) Prior Publication Data

US 2022/0157746 A1 May 19, 2022

(51) Int. Cl.
*H01L 23/66* (2006.01)
*H01L 23/538* (2006.01)
*H01L 21/683* (2006.01)
*H01L 21/48* (2006.01)
*H01L 21/56* (2006.01)
*H01Q 5/307* (2015.01)
*H01Q 1/48* (2006.01)
*H01L 23/31* (2006.01)
*H01Q 1/22* (2006.01)
*H01Q 21/06* (2006.01)

(52) U.S. Cl.
CPC .......... *H01L 23/66* (2013.01); *H01L 21/4853* (2013.01); *H01L 21/4857* (2013.01); *H01L 21/565* (2013.01); *H01L 21/568* (2013.01); *H01L 21/6831* (2013.01); *H01L 23/3128* (2013.01); *H01L 23/5383* (2013.01); *H01L 23/5386* (2013.01); *H01L 23/5389* (2013.01); *H01Q 1/48* (2013.01); *H01Q 5/307* (2015.01); *H01L 2221/68372* (2013.01); *H01L 2223/6677* (2013.01); *H01Q 1/2283* (2013.01); *H01Q 21/06* (2013.01)

(58) Field of Classification Search
CPC ............. H01L 21/4853; H01L 21/4857; H01L 21/565; H01L 21/568; H01L 21/6831; H01L 23/66; H01L 23/3128; H01L 23/5383; H01L 23/5386; H01L 23/5389; H01L 2221/68372; H01L 2223/6677; H01Q 1/48; H01Q 5/307; H01Q 21/06
See application file for complete search history.

(56) References Cited

U.S. PATENT DOCUMENTS

| 9,444,135 | B2 | 9/2016 | Tong et al. | |
| 2017/0346185 | A1* | 11/2017 | Wang | H01Q 9/065 |
| 2018/0139837 | A1* | 5/2018 | Kondou | H05K 1/0245 |
| 2018/0269273 | A1* | 9/2018 | Singh | H01L 28/60 |

(Continued)

*Primary Examiner* — Kyoung Lee
*Assistant Examiner* — Christina A Sylvia
(74) *Attorney, Agent, or Firm* — Foley & Lardner LLP

(57) ABSTRACT

The present disclosure provides an antenna module. The antenna module includes a first layer, a second layer, a first antenna, and a second antenna. The first layer has a first dielectric constant. The second layer is adjacent to the first layer. The second layer has a second Dk lower than the first Dk. The first antenna is disposed on the first layer and is configured for operating at a first frequency. The second antenna is disposed on the second layer and is configured for operating at a second frequency higher than the first frequency.

16 Claims, 11 Drawing Sheets

(56) References Cited

U.S. PATENT DOCUMENTS

2021/0328367 A1\* 10/2021 Tang .................... H01Q 1/2283
2021/0343664 A1\* 11/2021 Chang .................... H01L 23/66
2021/0366838 A1\* 11/2021 Han .................... H01Q 1/2283

\* cited by examiner

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly to a semiconductor device package including an antenna and a method of manufacturing the same.

2. Description of the Related Art

Wireless communication devices, such as cell phones, typically include antennas for transmitting and receiving radio frequency (RF) signals. Comparably, a wireless communication device includes an antenna and a communication module, each disposed on different parts of a circuit board. Under the comparable approach, the antenna and the communication module are separately manufactured and electrically connected together after being placed on the circuit board. Accordingly, separate manufacturing costs may be incurred for both components. Furthermore, it may be difficult to reduce a size of the wireless communication device to attain a suitably compact product design.

To reduce the cost and package size, an Antenna-in-Package (AiP) approach is provided. In general, an organic substrate is commonly used in an AiP system. However, due to the process limitation of the organic substrate, it is difficult to achieve fine-pitch (less than 15/15 μm), and the thickness of the organic substrate is relatively thick, which will hinder the miniaturization of the AiP system.

SUMMARY

In accordance with some embodiments of the present disclosure, an antenna module includes a first layer, a second layer, a first antenna, and a second antenna. The first layer has a first dielectric constant. The second layer is adjacent to the first layer. The second layer has a second Dk lower than the first Dk. The first antenna is disposed on the first layer and is configured for operating at a first frequency. The second antenna is disposed on the second layer and is configured for operating at a second frequency higher than the first frequency.

In accordance with some embodiments of the present disclosure, an antenna module includes a building-up layer, a low-frequency antenna, and a high-frequency antenna. The low-frequency antenna is disposed over the building-up layer. The high-frequency antenna is disposed over the building-up layer. An equivalent dielectric constant between the low-frequency antenna and the building-up layer is higher than an equivalent dielectric constant between the high-frequency antenna and the building-up layer.

In accordance with some embodiments of the present disclosure, a method of manufacturing an antenna module includes (a) providing a circuit layer and an antenna element on the circuit layer, the antenna element including a higher-dielectric-constant layer and a low-frequency antenna disposed on the higher-dielectric-constant layer; (b) forming a lower-dielectric-constant layer on the circuit layer and adjacent to the higher-dielectric-constant layer; and (c) forming a high-frequency antenna on the lower-dielectric-constant layer.

Figure 1A:
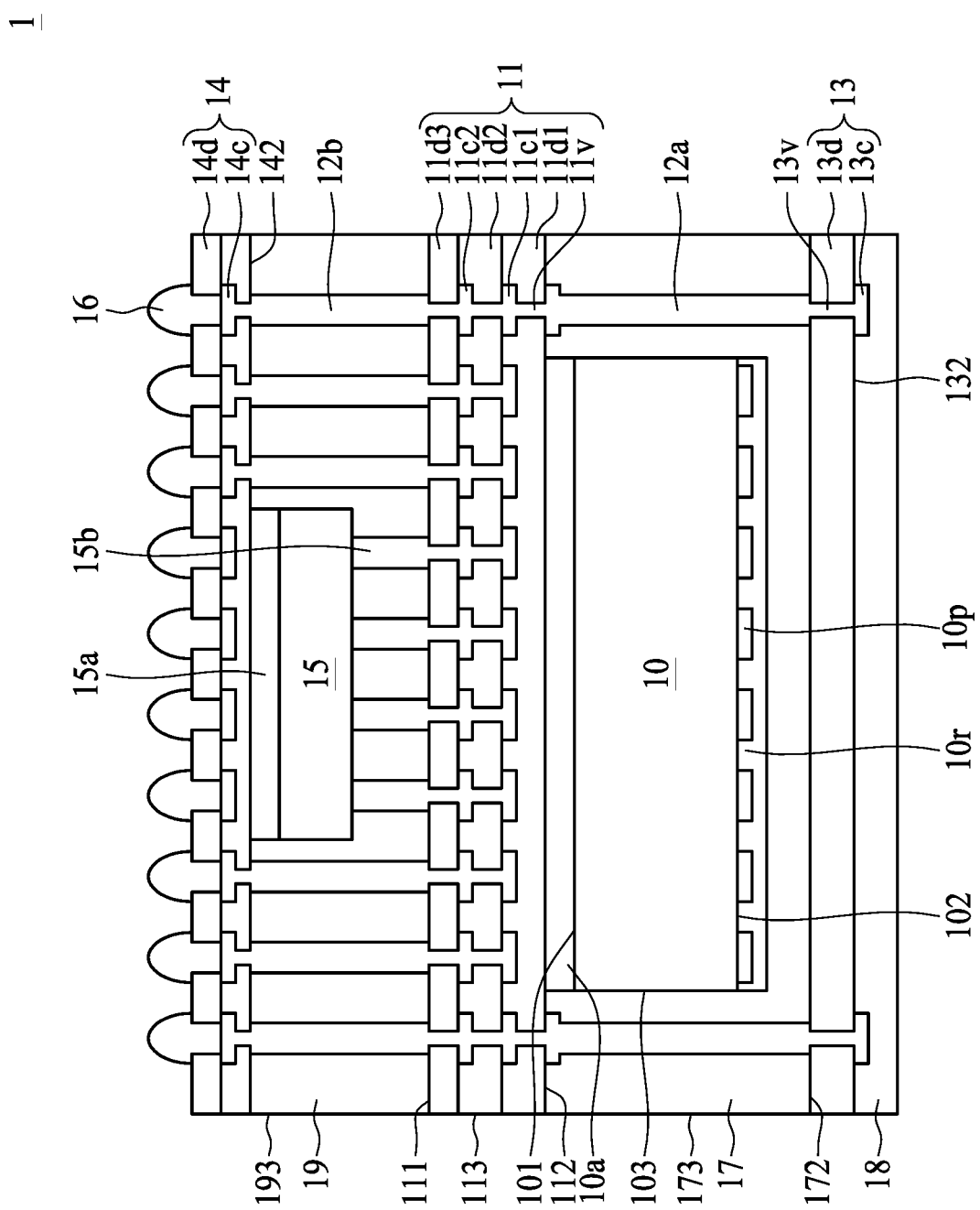
FIG. 1A illustrates a cross-sectional view of a semiconductor device package, in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1A illustrates a cross-sectional view of a semiconductor device package 1, in accordance with some embodiments of the present disclosure. The semiconductor device package 1 includes a carrier 10, circuit layers 11, 13, 14, interconnection structures 12a, 12b, an electronic component 15, electrical contacts 16 and package bodies 17, 18 and 19. In some embodiments, the semiconductor device 1 may be or include an antenna module.

In some embodiments, the carrier 10 may be or include a glass substrate. In some embodiments, the carrier 10 may be or include an emitting device having one or more emitting components (e.g., an antenna, a light emitting device, a sensor or the like) disposed thereon. The carrier 10 may include conductive pad(s), trace(s), and interconnection(s) (e.g. via(s)). In some embodiments, the carrier 10 may include transparent material. In some embodiments, the carrier 10 may include opaque material. The carrier 10 includes a material having a dielectric constant (Dk) less than approximately 5. The carrier 10 includes a material having a Dk less than approximately 3. The carrier 10 includes a material having a loss tangent or dissipation factor (Df) less than approximately 0.005. The carrier 10 includes a material having a loss tangent or Df less than approximately 0.003. The carrier 10 has a surface 101, a surface 102 opposite to the surface 101 and a lateral surface 103 extending between the surface 101 and the surface 102. Compared to the organic substrate, it is easier to control the thickness of a glass carrier, which can facilitate the miniaturization of the semiconductor device package 1. In some embodiments, the thickness of the carrier 10 is about 400 μm. In some embodiments, a coefficient of thermal expansion (CTE) of the carrier 10 is in a range from about 0.5 to about 13. In some embodiments, the CTE of the carrier 10 is in a range from about 3.6 to about 8.5.

A conductive layer 10p is disposed on the surface 102 of the carrier 10. In some embodiments, the conductive layer 10p defines a patterned antenna, such as a directional antenna, an omnidirectional antenna, an antenna array. For example, the conductive layer 10p defines a patch antenna. The conductive layer 10p is, or includes, a conductive material such as a metal or metal alloy. Examples of the conductive material include gold (Au), silver (Ag), copper (Cu), platinum (Pt), Palladium (Pd), other metal(s) or alloy (s), or a combination of two or more thereof. In some embodiments, the conductive layer $10p$ may be replaced by one or more light emitting devices or sensors.

A protection layer $10r$ is disposed on the surface $102$ of the carrier $10$ to cover the conductive layer $10p$. In some embodiments, the projection layer $10r$ may be formed or include a dielectric material, such as pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of a pre-preg may include, but are not limited to, a multi-layer structure formed by stacking or laminating a number of pre-impregnated materials/sheets. In other embodiments, the projection layer $10r$ may be omitted.

The circuit layer $11$ (or building-up circuit) has a surface $111$ facing away from the carrier $10$, a surface $112$ opposite to the surface $111$, and a lateral surface $113$ extending between the surface $111$ and the surface $112$. The carrier $10$ is disposed on the surface $112$ of the circuit layer $11$. The carrier $10$ is connected to the surface $112$ of the circuit layer $11$ through an adhesive layer $10a$ (e.g., a die attach film, DAF). The carrier $10$ is spaced apart from the circuit layer $11$. For example, there is a distance (e.g., a thickness of the adhesive layer $10a$) between the surface $101$ of the carrier $10$ and the surface $112$ of the circuit layer $11$. In some embodiments, the lateral surface $113$ of the circuit layer $11$ and the lateral surface $103$ of the carrier $10$ are noncoplanar or discontinuous. For example, the lateral surface $103$ of the carrier $10$ is recessed from the lateral surface $113$ of the circuit layer $11$. For example, a width of the carrier $10$ is less than a width of the circuit layer $11$.

The circuit layer $11$ includes one or more conductive layers (e.g., redistribution layers, RDLs) $11c1$, $11c2$ and one or more dielectric layers $11d1$, $11d2$, $11d3$. A portion of the conductive layers $11c1$, $11c2$ is covered or encapsulated by the corresponding dielectric layers $11d1$, $11d2$, $11d3$ while another portion of the conductive layers $11c1$, $11c2$ is exposed from the dielectric layers $11d1$, $11d2$, $11d3$ to provide electrical connections. In some embodiments, the conductive layer $11c1$ may be or include one or more antenna patterns, light emitting devices, sensors or the like. The conductive layer $11c1$ may be electrically connected to the interconnection structure $12a$ (e.g., a conductive pillar) through a conductive via $11v$. In some embodiments, the conductive layer $11c1$ may function as an antenna (e.g., a radiator).

In some embodiments, each of the dielectric layers $11d1$, $11d2$, $11d3$ may include pre-impregnated composite fibers (e.g., pre-preg), BPSG, silicon oxide, silicon nitride, silicon oxynitride, USG, any combination of two or more thereof, or the like. Examples of a pre-preg may include, but are not limited to, a multi-layer structure formed by stacking or laminating a number of pre-impregnated materials/sheets. In some embodiments, each of the conductive layers $11c1$, $11c2$ and the conductive via $11v$ is formed of or includes Au, Ag, Cu, Pt, Pd, or an alloy thereof. In some embodiments, there may be any number of conductive layers and dielectric layers depending on design specifications.

One or more interconnection structures $12a$ (e.g., conductive pillars or conductive elements) are disposed on the surface $112$ of the circuit layer $11$. The interconnection structures $12a$ are electrically connected to the circuit layer $11$ (i.e., to the conductive layer $11c1$ through the conductive via $11v$). In some embodiments, the interconnection structures $12a$ define an antenna structure. The interconnection structure $12a$ is, or includes, a conductive material such as a metal or metal alloy. Examples of the conductive material include Au, Ag, Cu, Pt, Pd, or an alloy thereof. In some embodiments, the interconnection structure $12a$ may function as a feeding element (e.g., a feed line).

The package body $17$ (or an encapsulant layer) is disposed on the surface $112$ of the circuit layer $11$. The package body $17$ covers the carrier $10$, the conductive layer $10p$, the protection layer $10r$, and the interconnection structure $12a$. The package body $17$ covers the lateral surface $103$ of the carrier $10$ and a lateral surface of the adhesive layer $10a$. The package body $17$ covers lateral surfaces of the interconnection structure $12$. In some embodiments, the package body $17$ has a lateral surface $173$ substantially coplanar with the lateral surface $113$ of the circuit layer $11$. The lateral surface $103$ of the carrier $10$ is recessed from the lateral surface $173$ of the package body $17$. For example, there is a distance between the lateral surface $103$ of the carrier $10$ and the lateral surface $173$ of the package body $17$. In some embodiments, the package body $17$ includes an epoxy resin including fillers, a molding compound (e.g., an epoxy molding compound or other molding compound), a polyimide, a phenolic compound or material, a material including a silicone dispersed therein, or a combination thereof.

The circuit layer $13$ (or building-up circuit) is disposed on a surface $172$ of the package body $18$. The circuit layer $13$ has a dielectric layer $13d$ and a conductive layer $13c$. The conductive layer $13c$ is electrically connected to the interconnection structure $12a$ through one or more conductive vias $13v$. In some embodiments, the dielectric layer $13d$ may include the same material as the dielectric layers $11d1$, $11d2$, $11d3$. Alternatively, the dielectric layer $13d$ and the dielectric layers $11d1$, $11d2$, $11d3$ may include different materials. The conductive layer $13c$ is disposed on a surface $132$ of the dielectric layer $11d$ facing away from the circuit layer $11$. The conductive layer $13c$ is covered or encapsulated by the package body $18$. In some embodiments, there may be any number of conductive layers and dielectric layers depending on design specifications. In some embodiments, the dielectric layer $13d$ has a Dk lower than that of the carrier $10$.

Figure 1B:
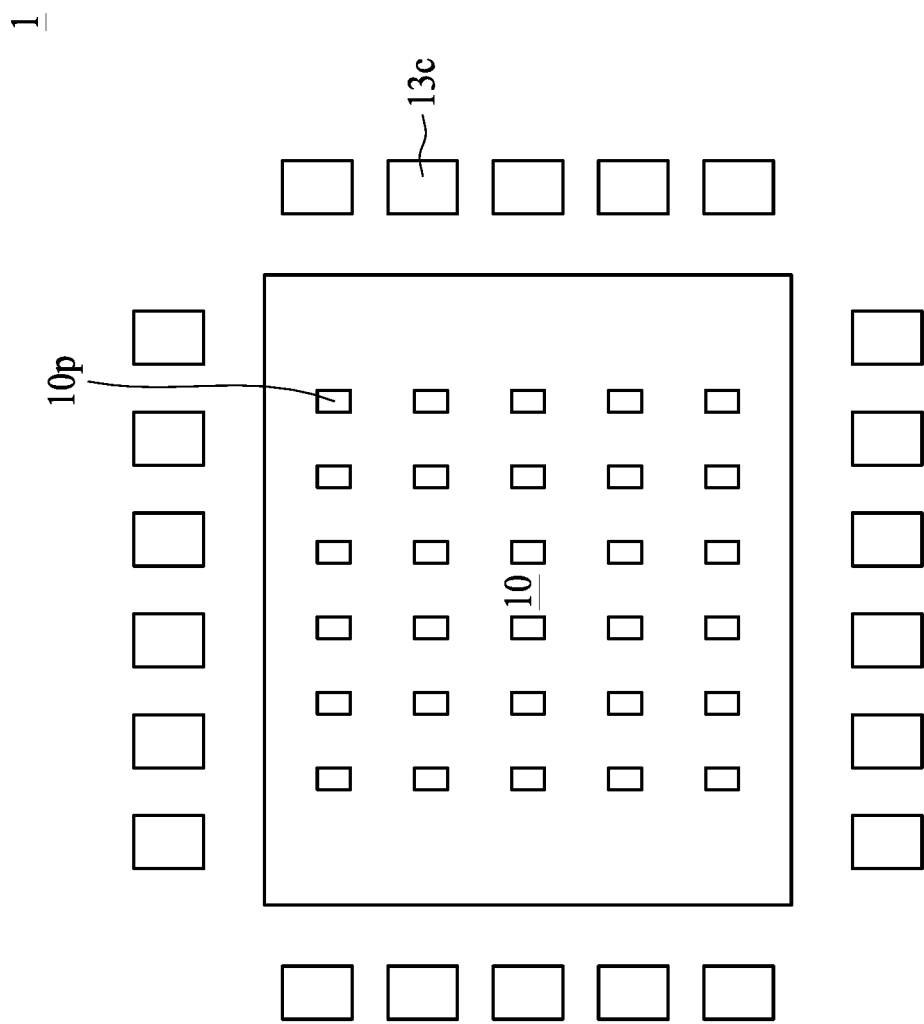
FIG. 1B illustrates a bottom view of a semiconductor device package, in accordance with some embodiments of the present disclosure.
Figure 1C:
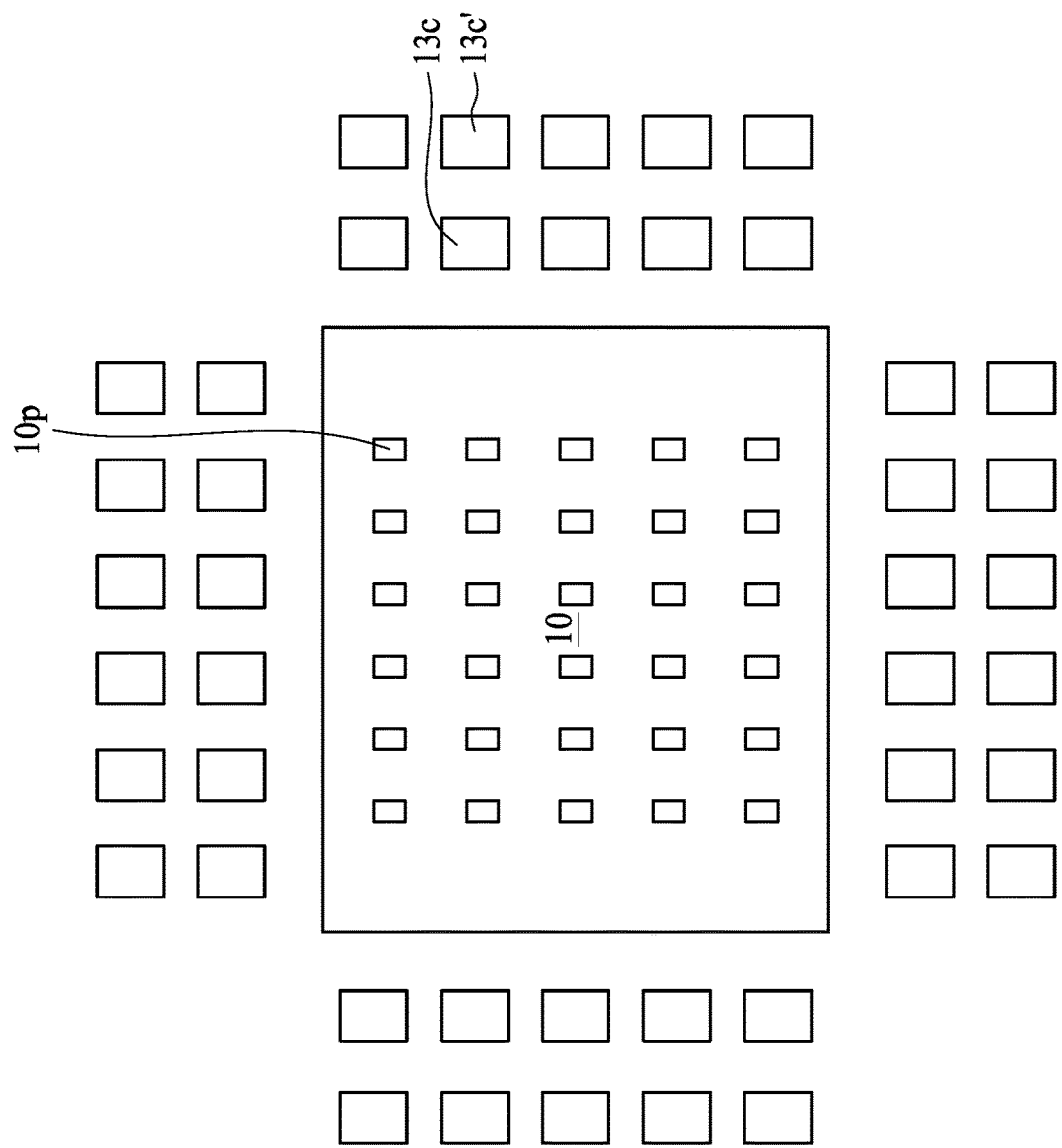
FIG. 1C illustrates a bottom view of a semiconductor device package, in accordance with some embodiments of the present disclosure.

In some embodiments, the conductive layer $13c$ may be or include one or more antenna patterns, light emitting devices, sensors or the like. In some embodiments, the conductive layer $13c$ defines a patterned antenna, such as a directional antenna, an omnidirectional antenna, an antenna array. For example, the conductive layer $13c$ defines a patch antenna. In some embodiments, the conductive via $13v$ penetrating the dielectric layer $13d$ may function as a feeding element for the conductive layer $13c$. The conductive layer $13c$ and the conductive layer $10p$ may define antennas having different frequencies or bandwidths. In some embodiments, the conductive layer $13c$ may define an antenna having a frequency higher than a frequency of the antenna defined by the conductive layer $10p$. For example, the antenna (which can be referred to as a high-band antenna) defined by the conductive layer $13c$ may be operated or radiated in a frequency of 39 GHz. For example, the antenna (which can be referred to as a low-band antenna) defined by the conductive layer $10p$ may be operated or radiated in a frequency of 28 GHz. Hence, by incorporating the antennas having different operating frequencies, the semiconductor device package $1$ may achieve a multi-bandwidth (or multi-frequency) radiation. In some embodiments, as shown in FIG. 1B, which illustrates a bottom view of the semiconductor device package $1$ (for clarity, some of the elements are omitted in FIG. 1B), the conductive layer $13c$ (and the conductive vias 13v electrically connected to the conductive layer 13c) may surround the conductive layer 10p (and the carrier 10). In some embodiments, the conductive layer 13c disposed along all the edges of the carrier 10 may function as an antenna or an antenna array. In some embodiments, the conductive layer 13c disposed along one edge of the carrier 10 may function as an antenna (or a radiator) or an antenna array while the conductive layer 13c disposed along the other edges of the carrier 10 may function as a reflector.

In some embodiments, the equivalent Dk between the conductive layer 13c and ground is lower than the equivalent Dk between the conductive layer 10p and ground. For example, the equivalent Dk between the conductive layer 13c and ground may include the Dk of the dielectric layer 13d, the package body 17, and the dielectric layer 11d1. For example, the equivalent Dk between the conductive layer 10p and ground may include the Dk of the carrier 10, the adhesive layer 10a, and the dielectric layer 11d1. Hence, the layer (e.g., the dielectric layer 13d) on which the conductive layer 13c is disposed may be referred to as a low-Dk layer, while the layer (e.g., the carrier 10) on which the conductive layer 10p is disposed may be referred to as a high-Dk layer. In some embodiments, the equivalent Dk between the conductive layer 13c and air is lower than the equivalent Dk between the conductive layer 10p and air. For example, the equivalent Dk between the conductive layer 10p and air may include the Dk of the protection layer 10r, the package body 17, the dielectric layer 13d, and the package body 18. For example, the equivalent Dk between the conductive layer 13c and air may include the Dk of the package body 18.

In some embodiments, as shown in FIG. 1B, which illustrates a bottom view of the semiconductor device package 1 (for clarity, some of the elements are omitted in FIG. 1B), the semiconductor device package 1 may further include a conductive layer 13c' surrounding the conductive layer 13c. The conductive layer 13c' may be aligned with the conductive layer 13c. In some embodiments, the conductive layer 13c may function as an antenna or an antenna array while the conductive layer 13c' may function as a director. In some embodiments, there may be any number of conductive layers surrounding the carrier 10. For example, the conductive layers may be arranged in an M×N array, where each of M and N is an integer equal to or greater than 1.

Figure 1D:
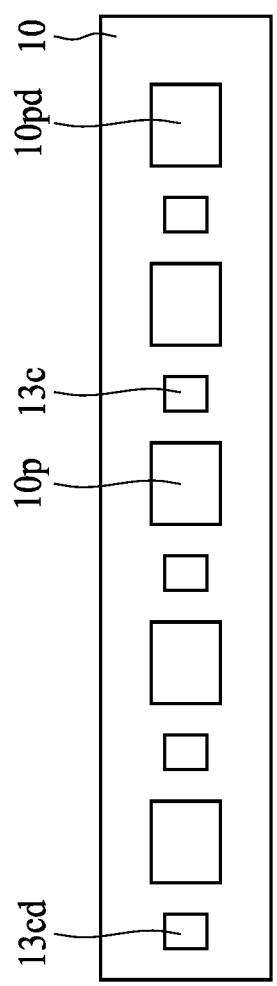
FIG. 1D illustrates a bottom view of a semiconductor device package, in accordance with some embodiments of the present disclosure.

In some embodiments, as shown in FIG. 1D, both the conductive layer 13c and the conductive layer 10p defining antennas with different frequencies can be alternatively disposed on the surface 102 of the carrier 10. To avoid the interference between the antennas having different frequencies, the antennas should be spaced apart from each other by a predetermined distance. In addition, to achieve a better performance, the conductive layer 13c and the conductive layer 10p are arranged symmetrically, and thus, dummy antenna patterns 10pd and 13cd are required. This would increase the area of the carrier 10 (or the semiconductor device package). If the area of the carrier 10 is limited, the size of each of the conductive layer 13c and the conductive layer 10p should be reduced, which would reduce the gain of the antennas defined by the conductive layer 13c and the conductive layer 10p.

In accordance with the embodiments as shown in FIG. 1A and FIG. 1B, the conductive layer 10p and the conductive layer 13c are disposed on the carrier 10 and the dielectric layer 13d respectively. For example, the conductive layer 10p and the conductive layer 13c are disposed on different elevations with respect to the surface 112 of the circuit layer 11. For example, the conductive layer 10p and the conductive layer 13c are disposed on different elevations with respect to ground (e.g., a portion of the conductive layer 11c1 and/or 11c2). For example, the conductive layer 10p and the conductive layer 13c are not overlapping in both vertical and horizontal directions. Therefore, the interference between the conductive layer 10p and the conductive layer 13c can be mitigated. In addition, the size of the conductive layer 10p or the conductive layer 13c would not be limited by the size of the carrier 10, which would increase the gain of the antennas defined by the conductive layer 10p and the conductive layer 13c. Since no dummy antenna is required, the area of the semiconductor device package 1 can be reduced.

Furthermore, since the conductive layer 10p and the conductive layer 13c have different transmission mediums (e.g., the carrier 10 for the conductive layer 10p and the dielectric layer 13d for the conductive layer 13c), it is more flexible to design the arrangements or layouts of the conductive layer 10p and the conductive layer 13c. For example, since the Dk of the dielectric layer 13d is lower than that of the carrier 10, the size of the conductive layer 13c can be enlarged, which can increase the gain of the antenna defined by the conductive layer 13c.

The package body 18 (or an encapsulant layer) is disposed on the surface 132 of the circuit layer 13. The package body 18 covers the conductive layer 13c. In some embodiments, the package body 18 has a lateral surface substantially coplanar with the lateral surface of the circuit layer 13. In some embodiments, the package body 18 includes an epoxy resin including fillers, a molding compound (e.g., an epoxy molding compound or other molding compound), a polyimide, a phenolic compound or material, a material including a silicone dispersed therein, or a combination thereof.

One or more interconnection structures 12b (e.g., conductive pillars or conductive elements) are disposed on the surface 111 of the circuit layer 11. The interconnection structures 12b are electrically connected to the circuit layer 11. The interconnection structure 12b is, or includes, a conductive material such as a metal or metal alloy. Examples of the conductive material include Au, Ag, Cu, Pt, Pd, or an alloy thereof.

The package body 19 is disposed on the surface 111 of the circuit layer 11. The package body 19 covers the interconnection structures 12b and the electronic component 15. In some embodiments, the package body 19 has a lateral surface 193 substantially coplanar with the lateral surface 113 of the circuit layer 11. In some embodiments, the package body 19 includes an epoxy resin including fillers, a molding compound (e.g., an epoxy molding compound or other molding compound), a polyimide, a phenolic compound or material, a material including a silicone dispersed therein, or a combination thereof.

The circuit layer 14 (or building-up circuit) is disposed on the package body 19. The circuit layer 14 has a dielectric layer 14d and a conductive layer 14c. In some embodiments, the dielectric layer 14d may include the same material as the dielectric layer 11d. Alternatively, the dielectric layer 14d and the dielectric layer 11d may include different materials. The conductive layer 14c is electrically connected to the interconnection structures 12b. In some embodiments, there may be any number of conductive layers and dielectric layers depending on design specifications.

The electronic component 15 is disposed on the surface 142 of the circuit layer 14. The electronic component 15 may be an active electronic component, such as an integrated circuit (IC) chip or a die. The electronic component 15 has a backside surface bonded or attached to the surface 142 of the circuit layer 14 by an adhesion layer 15a (e.g., DAF).

The electronic component 15 has an active surface facing the circuit layer 11 and electrically connected to the circuit layer 11 through the interconnection structures 15b (e.g., conducive pillars).

The electrical contacts 16 are disposed on the conductive layer 14c exposed from the dielectric layer 14d. In some embodiments, the electrical contacts 16 may include solder or other suitable material(s).

FIG. 2A, FIG. 2B, FIG. 2C, FIG. 2D, FIG. 2E, FIG. 2F, and FIG. 2G illustrate a semiconductor manufacturing method in accordance with some embodiments of the present disclosure. In some embodiments, the method in FIG. 2A, FIG. 2B, FIG. 2C, FIG. 2D, FIG. 2E, FIG. 2F, and FIG. 2G can be used to manufacture the semiconductor device package 1 in FIG. 1A.

Figure 2A:
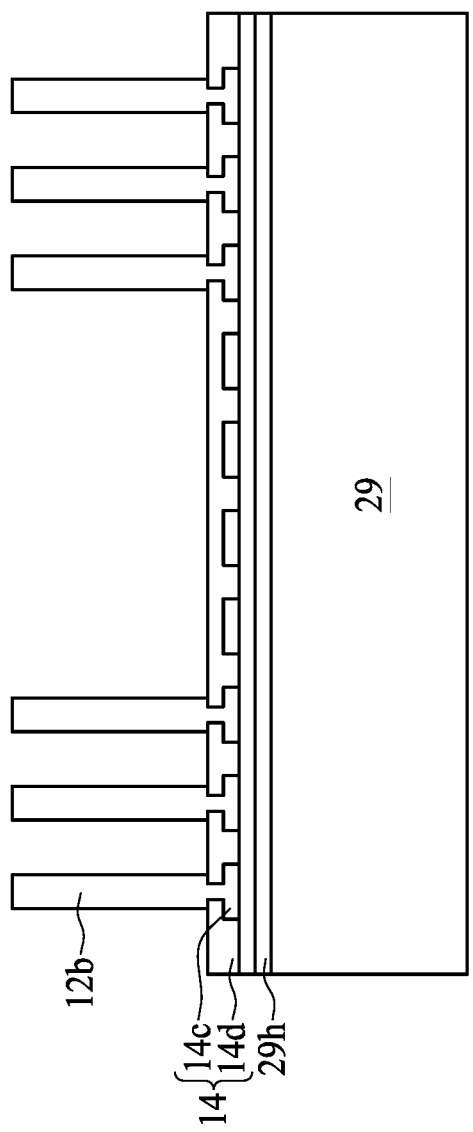
FIG. 2A, FIG. 2B, FIG. 2C, FIG. 2D, FIG. 2E, FIG. 2F, and FIG. 2G illustrate a semiconductor manufacturing method in accordance with some embodiments of the present disclosure.

Referring to FIG. 2A, a carrier 29 having an adhesive layer 29h is provided. A circuit layer 14 including a conductive layer 14c and a dielectric layer 14d is formed on the carrier 29. Interconnection structures 12b are then formed on the circuit layer 14 to be electrically connected to the circuit layer 14. The dielectric layer 14d is formed by, for example but is not limited to, photolithographic technique. In some embodiments, the interconnection structures 12b may be formed by, for example but is not limited to, plating technique.

Figure 2B:
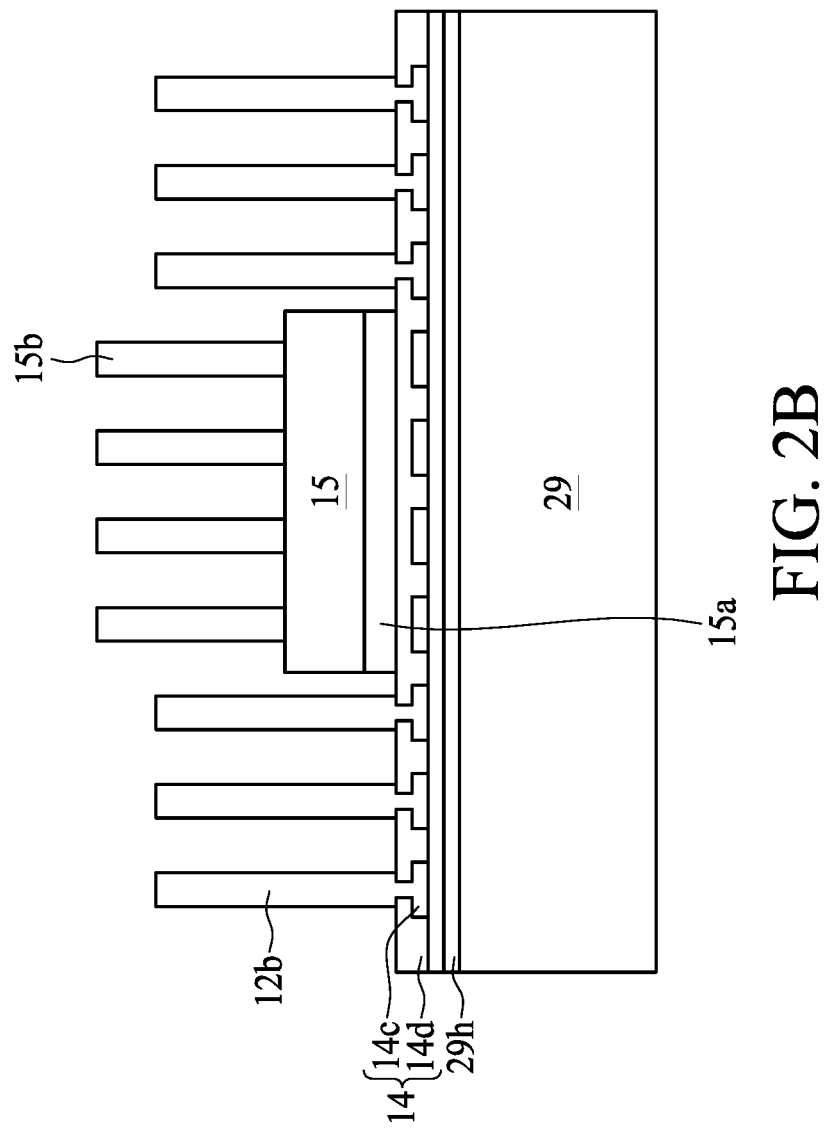

Referring to FIG. 2B, an electronic component 15 is disposed on the circuit layer 14. In some embodiments, a backside surface of the electronic component 15 is attached to the circuit layer 14 through an adhesive layer 15a. Interconnection structures 15b are then formed on an active surface of the electronic component 15 to be electrically connected to the electronic component 15. In some embodiments, the interconnection structures 15b may be formed by, for example but is not limited to, plating technique.

Figure 2C:
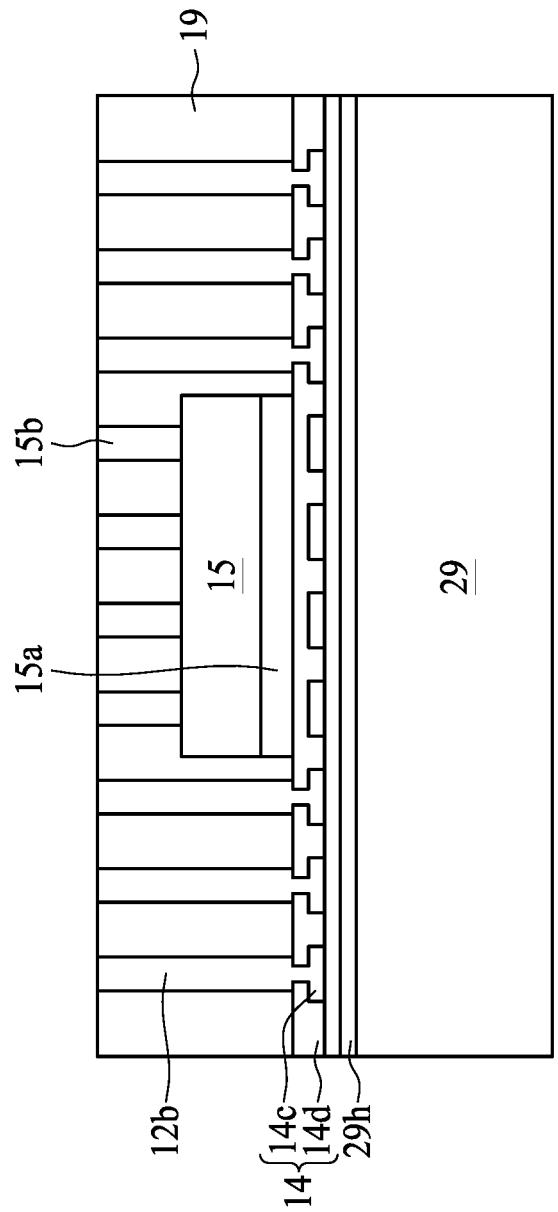

Referring to FIG. 2C, a package body 19 is formed on the circuit layer 14 to cover the interconnection structures 12b, 15b and the electronic component 15. In some embodiments, the package body 19 may be formed to fully cover the interconnection structures 12b, 15b and the electronic component 15. A portion of the package body 19 and the interconnection structures 12b, 15b is then removed by, for example, grinding or any other suitable techniques to expose a top portion of the interconnection structures 12b and 15b for electrical connections. In some embodiments, the package body 19 is formed by, for example, by a transfer molding technique, a compression technique or any other suitable techniques.

Figure 2D:
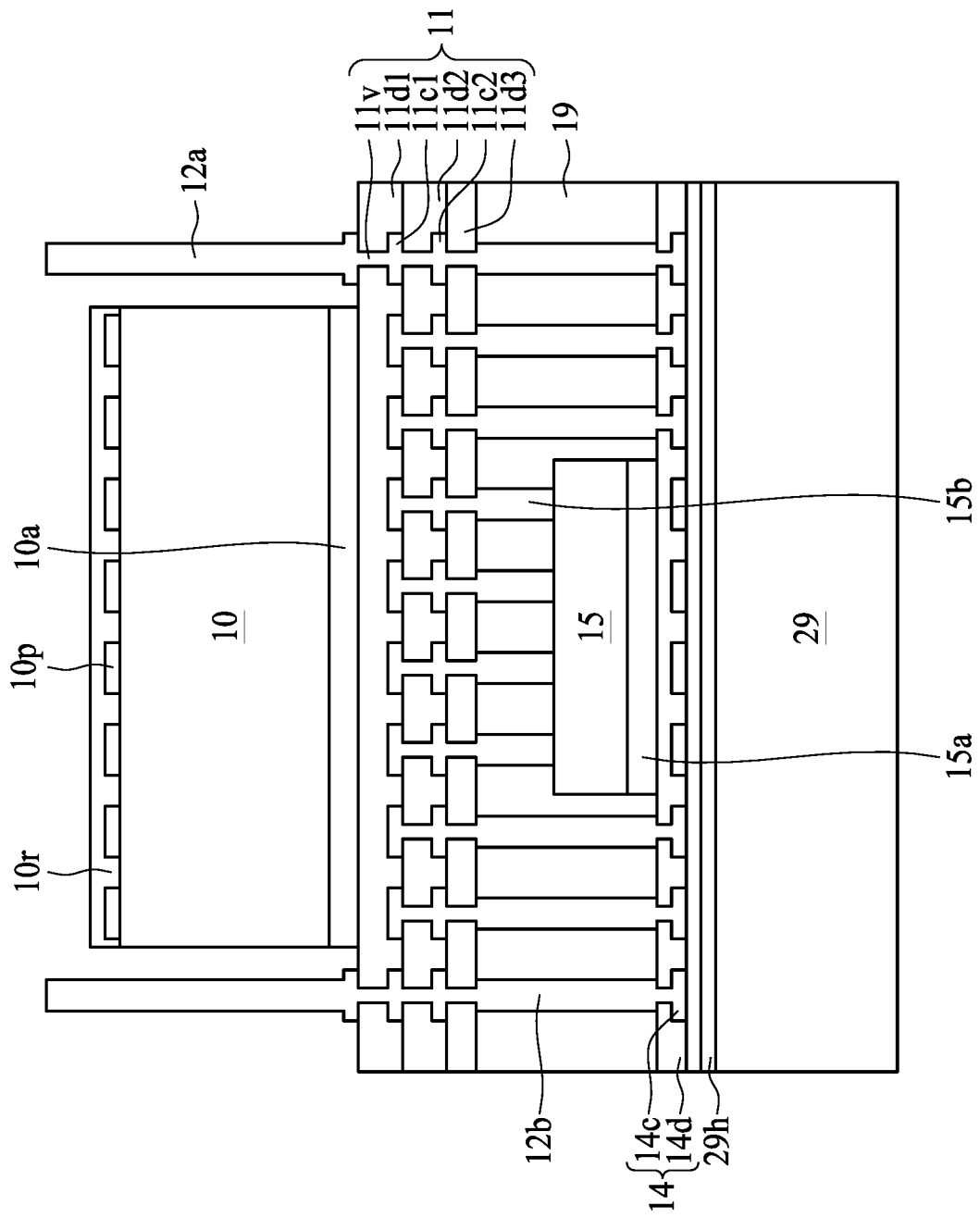

Referring to FIG. 2D, a circuit layer 11 including conductive layers 11c1, 11c2, dielectric layers 11d1, 11d2, 11d3, and a conductive via 11v is formed on the package body 19 and electrically connected to the interconnection structures 12b and 15b exposed from the package body 19. Interconnection structures 12a are then formed on the circuit layer 11 to be electrically connected to the circuit layer 11. The dielectric layer 11d is formed by, for example but is not limited to, photolithographic technique. In some embodiments, the interconnection structures 12a may be formed by, for example but is not limited to, plating technique.

A carrier 10 having a conductive layer 10p thereon is disposed on the circuit layer 11. In some embodiments, the carrier 10 is attached to the circuit layer 11 through an adhesive layer 10a. In some embodiments, the carrier 10 may be formed by performing a singulation to divide a glass wafer into a plurality of glass carriers including the carrier 10. In some embodiments, a projection layer 10r may be formed on the carrier 10 to cover the conductive layer 10p.

Figure 2E:
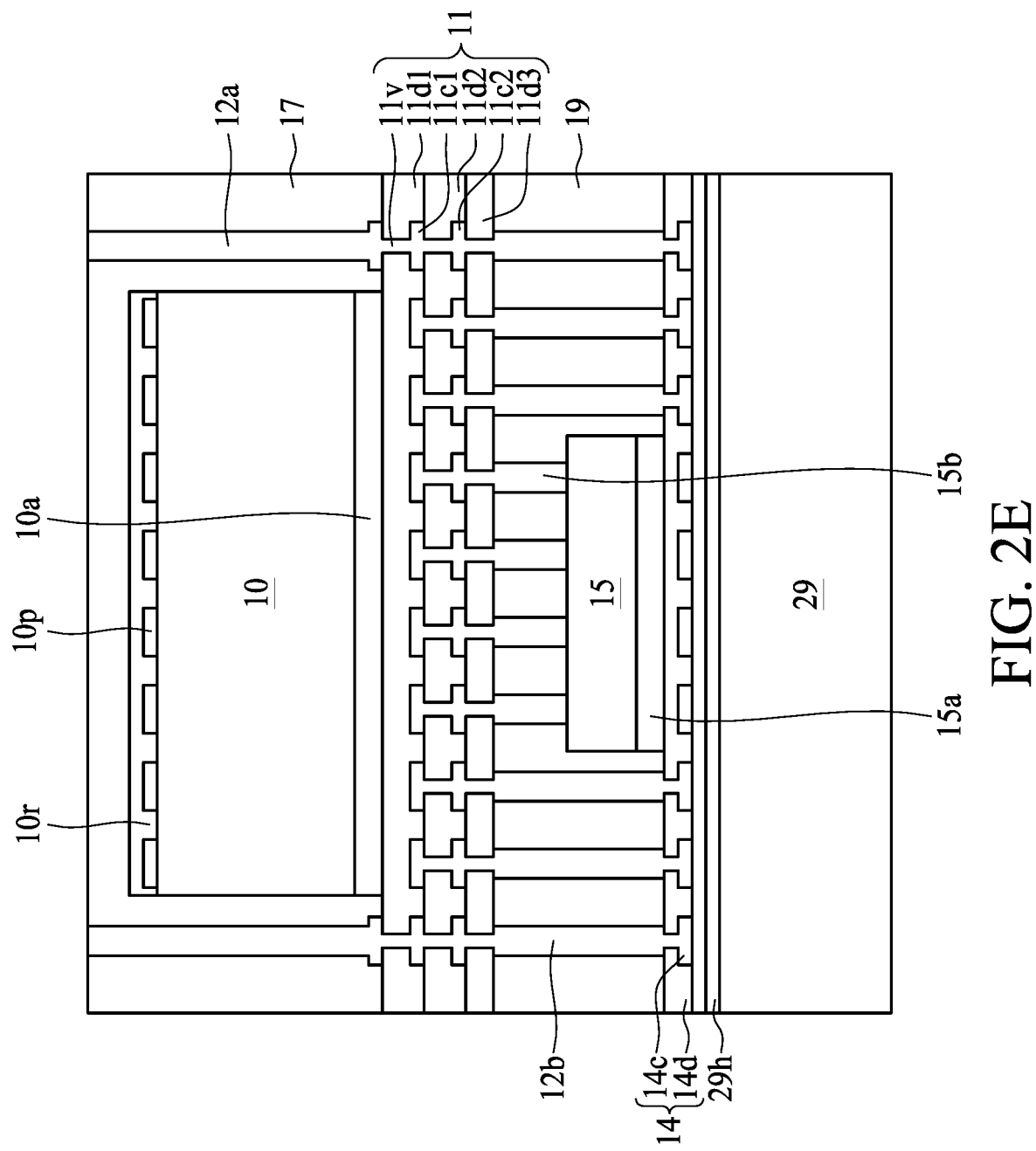

Referring to FIG. 2E, a package body 17 is formed on the circuit layer 11 to cover the carrier 10 and the interconnection structures 12a. In some embodiments, the package body 17 is formed by, for example, by a transfer molding technique, a compression technique or any other suitable techniques. In some embodiments, the package body 17 may be formed to fully cover the interconnection structures 12a. A portion of the package body 19 is then removed by, for example, grinding or any other suitable techniques to expose a top portion of the interconnection structures 12a for electrical connections.

Figure 2F:
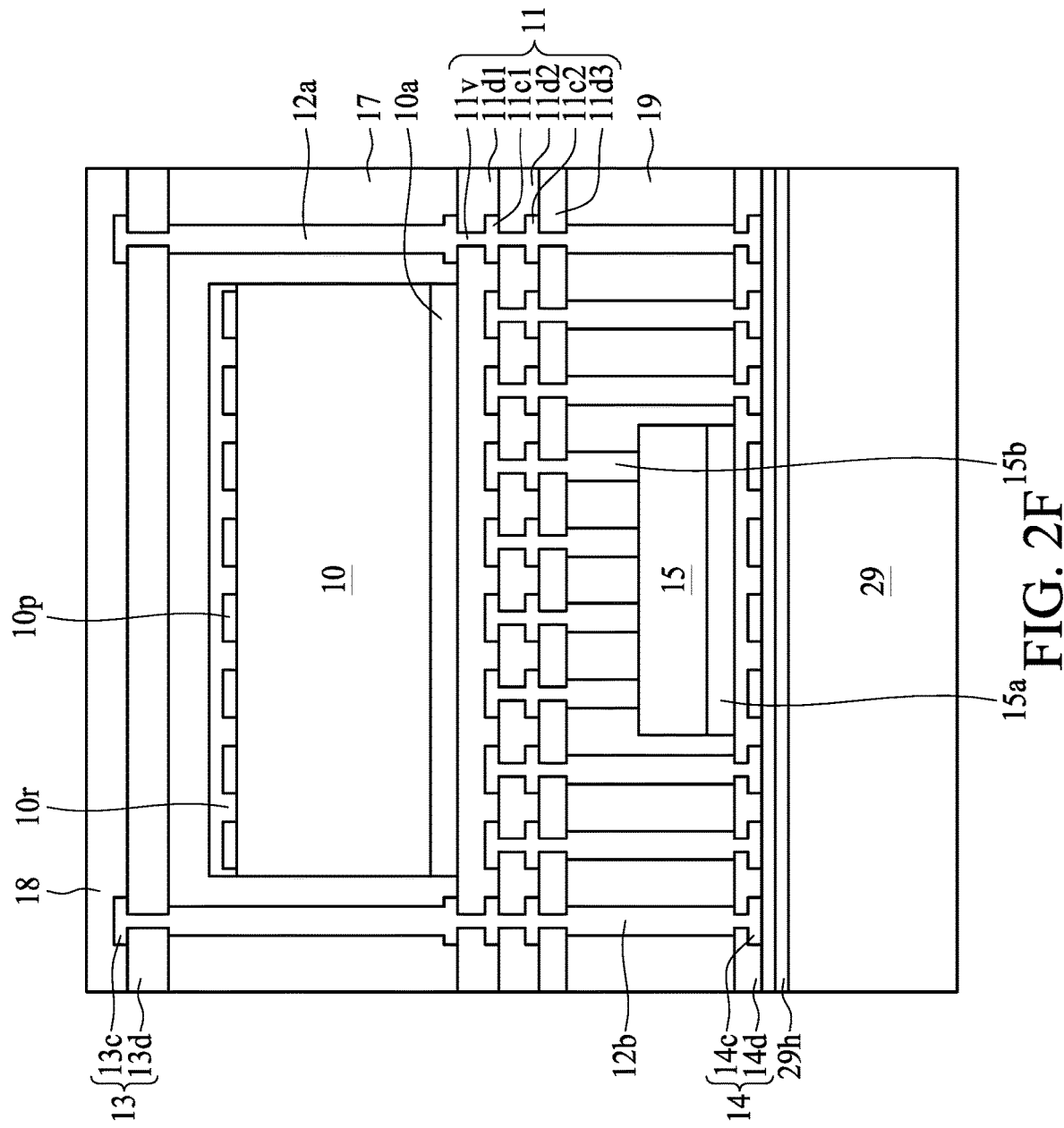

Referring to FIG. 2F, a circuit layer 13 including a conductive layer 13c and a dielectric layer 13d is formed on the package body 17 and electrically connected to the interconnection structures 12a exposed from the package body 17. The dielectric layer 13d is formed by, for example but is not limited to, photolithographic technique.

A package body 18 is formed on the circuit layer 13 to cover the conductive layer 13c. In some embodiments, the package body 18 is formed by, for example, by a transfer molding technique, a compression technique or any other suitable techniques.

Figure 2G:
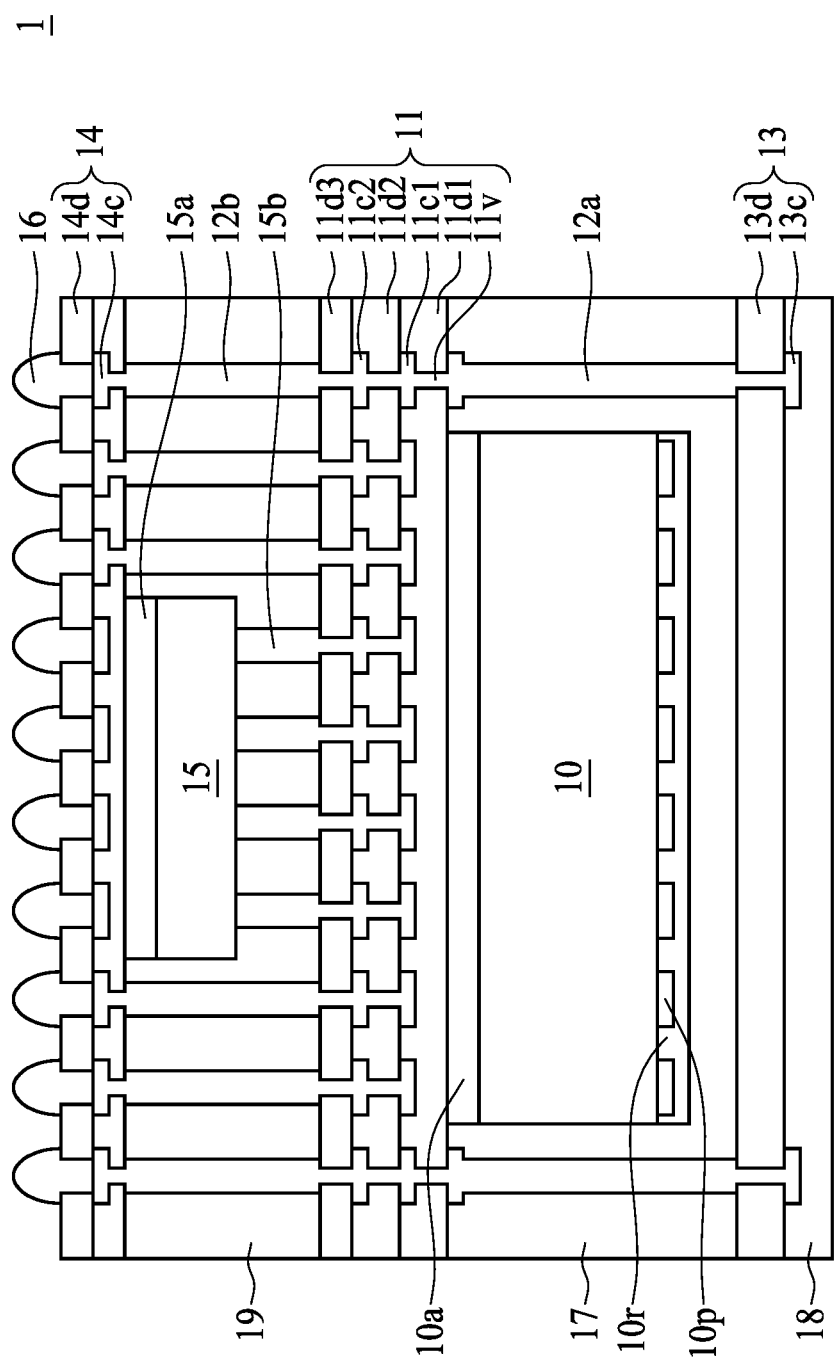

Referring to FIG. 2G, the carrier 29 is removed from the circuit layer 14 to expose the conductive layer 14c. Electrical contacts 16 are then disposed on the conductive layer 14c exposed from the dielectric layer 14d.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An antenna module, comprising:
    a first layer having a first dielectric constant (Dk);
    a second layer adjacent to the first layer, the second layer having a second Dk lower than the first Dk;
    a first antenna disposed on the first layer, the first antenna configured for operating at a first frequency;
    a second antenna disposed on the second layer, the second antenna configured for operating at a second frequency higher than the first frequency; and
    a plurality of feeding elements penetrating the second layer and electrically connected to the second antenna, wherein the feeding elements surround the first layer.

2. The antenna module of claim 1, wherein the first antenna and the second antenna have different elevations with respect to ground.

3. The antenna module of claim 2, wherein a distance between the first antenna and ground is less than a distance between the second antenna and ground.

4. The antenna module of claim 1, wherein the first antenna and the second antenna are non-overlapping in both horizontal and vertical directions with respect to the first layer.

5. The antenna module of claim 1, wherein the first layer includes an adhesive layer and a first dielectric layer disposed between the first antenna and the adhesive layer.

6. The antenna module of claim 1, wherein the second layer includes a first encapsulant layer covering the first layer and a second dielectric layer disposed between the second antenna and the first encapsulant layer.

7. The antenna module of claim 6, further comprising:
    a plurality of feeding elements penetrating the second layer and electrically connected to the second antenna, wherein the feeding elements include a first portion penetrating the first encapsulant layer and a second portion penetrating the second dielectric layer.

8. The antenna module of claim 1, further comprising:
    a first circuit layer on which the first layer and the second layer are disposed; and
    an electronic component disposed on first the circuit layer.

9. The antenna module of claim 8, further comprising:
    an interconnection structure disposed on the first circuit layer and adjacent to the electronic component;
    a second encapsulant layer covering the electronic component; and
    a second circuit layer on which the second encapsulant layer is disposed.

10. The antenna module of claim 1, wherein the second layer surrounds the first layer.

11. A method of manufacturing an antenna module, the method comprising:
    (a) providing a circuit layer and an antenna element on the circuit layer, the antenna element including a higher-dielectric-constant layer and a low-frequency antenna disposed on the higher-dielectric-constant layer;
    (b) forming a lower-dielectric-constant layer on the circuit layer and adjacent to the higher-dielectric-constant layer; and
    (c) forming a high-frequency antenna on the lower-dielectric-constant layer, wherein (a) further comprises:
    (a1) connecting the higher-dielectric-constant layer on the circuit layer by an adhesive layer.

12. The method of claim 11, wherein (b) further comprises:
    (b1) forming the lower-dielectric-constant layer to encapsulate the higher-dielectric-constant layer.

13. The method of claim 12, wherein (b) further comprises:
    (b2) forming a feeding element penetrating the lower-dielectric-constant layer to be electrically connected to the high-frequency antenna.

14. The method of claim 11, wherein (c) further comprises:
    (c1) forming the high-frequency antenna on the lower-dielectric-constant layer and surrounding the low-frequency antenna.

15. An antenna module, comprising:
    a first layer having a first Dk;
    a second layer adjacent to the first layer, the second layer having a second Dk lower than the first Dk;
    a first antenna disposed on the first layer, the first antenna configured for operating at a first frequency; and
    a second antenna disposed on the second layer, the second antenna configured for operating at a second frequency higher than the first frequency, wherein the first layer includes an adhesive layer and a dielectric layer disposed between the first antenna and the adhesive layer.

16. An antenna module, comprising:
a first layer having a first Dk;
a second layer adjacent to the first layer, the second layer having a second Dk lower than the first Dk;
a first antenna disposed on the first layer, the first antenna configured for operating at a first frequency;
a second antenna disposed on the second layer, the second antenna configured for operating at a second frequency higher than the first frequency, wherein the second layer includes a encapsulant layer covering the first layer and a dielectric layer disposed between the second antenna and the encapsulant layer; and
a plurality of feeding elements penetrating the second layer and electrically connected to the second antenna, wherein the feeding elements include a first portion penetrating the encapsulant layer and a second portion penetrating the dielectric layer.

* * * * *